(12) United States Patent
Wang et al.

(10) Patent No.: US 8,076,056 B2
(45) Date of Patent: Dec. 13, 2011

(54) METHOD OF MAKING SUB-RESOLUTION PILLAR STRUCTURES USING UNDERCUTTING TECHNIQUE

(75) Inventors: Chun-Ming Wang, Fremont, CA (US);
Steven Maxwell, Sunnyvale, CA (US);
Paul Wai Kie Poon, Fremont, CA (US);
Yung-Tin Chen, Santa Clara, CA (US)

(73) Assignee: SanDisk 3D LLC, Milpitas, CA (US)

( * ) Notice: Subject to any disclaimer, the term of this patent is extended or adjusted under 35 U.S.C. 154(b) by 657 days.

(21) Appl. No.: 12/285,466

(22) Filed: Oct. 6, 2008

(65) Prior Publication Data
US 2010/0086875 A1 Apr. 8, 2010

(51) Int. Cl.
*G03F 7/26* (2006.01)
(52) U.S. Cl. .................................................... 430/313
(58) Field of Classification Search .................. 430/313, 430/314, 316, 317
See application file for complete search history.

(56) References Cited

U.S. PATENT DOCUMENTS

| | | | |
|---|---|---|---|
| 5,024,971 A | 6/1991 | Baker et al. | |
| 5,482,885 A | 1/1996 | Lur et al. | |
| 5,739,068 A | 4/1998 | Jost et al. | |
| 5,915,167 A | 6/1999 | Leedy | |
| 5,977,638 A | 11/1999 | Rodgers et al. | |
| 6,055,180 A | 4/2000 | Gudesen et al. | |
| 6,096,659 A | 8/2000 | Gardner et al. | |
| 6,420,231 B1 | 7/2002 | Harari et al. | |
| 6,716,761 B2 * | 4/2004 | Mitsuiki | 438/706 |
| 6,853,049 B2 | 2/2005 | Herner | |
| 6,855,614 B2 | 2/2005 | Metzler | |
| 6,946,719 B2 | 9/2005 | Petti et al. | |
| 6,951,780 B1 | 10/2005 | Herner | |
| 6,952,030 B2 | 10/2005 | Herner et al. | |
| 7,081,377 B2 | 7/2006 | Cleeves | |
| 7,176,064 B2 | 2/2007 | Herner | |
| 7,211,866 B2 | 5/2007 | Yuan et al. | |
| 7,271,057 B2 | 9/2007 | Eppich | |
| 2002/0052068 A1 | 5/2002 | Juengling | |
| 2003/0157436 A1 | 8/2003 | Manger et al. | |
| 2003/0178684 A1 | 9/2003 | Nakamura | |
| 2004/0245557 A1 | 12/2004 | Seo et al. | |

(Continued)

FOREIGN PATENT DOCUMENTS

EP 0 288 739 A2 11/1988

(Continued)

OTHER PUBLICATIONS

International Bureau of WIPO. International Preliminary Report on Patentability, Intl. Application PCT/US09/02400.

(Continued)

*Primary Examiner* — Kathleen Duda
*Assistant Examiner* — Caleen Sullivan
(74) *Attorney, Agent, or Firm* — The Marbury Law Group, PLLC

(57) ABSTRACT

A method of making a device includes forming an underlying mask layer over an underlying layer, forming a first mask layer over the underlying mask layer, patterning the first mask layer to form first mask features, undercutting the underlying mask layer to form underlying mask features using the first mask features as a mask, removing the first mask features, and patterning the underlying layer using at least the underlying mask features as a mask.

26 Claims, 10 Drawing Sheets

U.S. PATENT DOCUMENTS

| | | | |
|---|---|---|---|
| 2005/0052915 | A1 | 3/2005 | Herner et al. |
| 2005/0226067 | A1 | 10/2005 | Herner et al. |
| 2006/0177977 | A1 | 8/2006 | Chan et al. |
| 2006/0216937 | A1 | 9/2006 | Dunton et al. |
| 2006/0250836 | A1 | 11/2006 | Herner et al. |
| 2006/0250837 | A1 | 11/2006 | Herner et al. |
| 2006/0273298 | A1 | 12/2006 | Petti |
| 2007/0049035 | A1 | 3/2007 | Tran |
| 2007/0072360 | A1 | 3/2007 | Kumar et al. |
| 2007/0099431 | A1 | 5/2007 | Li |
| 2007/0114509 | A1 | 5/2007 | Herner |
| 2007/0158688 | A1 | 7/2007 | Caspary et al. |
| 2007/0164309 | A1 | 7/2007 | Kumar et al. |
| 2007/0176160 | A1 | 8/2007 | Uchiyama et al. |
| 2007/0197014 | A1 | 8/2007 | Jeon et al. |
| 2008/0013364 | A1 | 1/2008 | Kumar et al. |
| 2008/0014533 | A1 | 1/2008 | Keller et al. |
| 2008/0085600 | A1 | 4/2008 | Furukawa et al. |
| 2008/0128867 | A1 | 6/2008 | Lee |
| 2009/0149026 | A1 | 6/2009 | Zhou et al. |

FOREIGN PATENT DOCUMENTS

| | | |
|---|---|---|
| EP | 1 818 977 A2 | 8/2007 |
| WO | WO 2007/103343 A1 | 9/2007 |

OTHER PUBLICATIONS

Notice of Allowance mailed Jan. 28, 2010 received in U.S. Appl. No. 12/216,109.

International Search Report mailed Mar. 4, 2010 received in PCT/US2009/059188.

U.S. Appl. No. 09/560,626, filed Apr. 28, 2000, Knall.

U.S. Appl. No. 11/864,205, filed Sep. 28, 2007, Yung-Tin Chen et al.

U.S. Appl. No. 11/864,532, filed Sep. 28, 2007, Maxwell.

U.S. Appl. No. 12/000,758, filed Dec. 17, 2007, Petti et al.

U.S. Appl. No. 12/007,780, filed Jan. 15, 2008, Herner et al.

U.S. Appl. No. 12/007,781, filed Jan. 15, 2008, Dunton et al.

U.S. Appl. No. 12/216,107, filed Jun. 30, 2008, Chan.

U.S. Appl. No. 12/149,151, filed Apr. 28, 2008, Chen et al.

U.S. Appl. No. 12/222,293, filed Aug. 6, 2008, Chan.

Kim, Ryoung H. et al., "Double Exposure Using 193 nm Negative Tone Photoresist", Optical Microlithography XX, Proc of SPIE, vol. 6520, 65202M, 2007, 8 pgs.

Nakamura, Hiroko et al., "Contact Hole Formation by Multiple Exposure Technique in Ultra-low $k_1$ Lithography", Optical Microlithography XVII, Proceedings of SPIE, vol. 5377, Feb. 24-27, 2004, pp. 255-263.

Nakamura, Hiroko et al., "Low $k_1$ Contact Hole Formation by Double Line and Space Formation Method with Contact Hole Mask and Dipole Illumination", The Japan Society of Applied Physics, vol. 45, No. 6B, 2000, pp. 5409-5417.

Office Action mailed Jul. 22, 2009, received in U.S. Appl. No. 12/000,758.

Partial International Search Report mailed Oct. 21, 2009, in International application No. PCT/US2009/048584.

International Search Report and Written Opinion mailed Oct. 9, 2009, received in International application No. PCT/US2009/048581.

International Search Report and Written Opinion mailed Sep. 7, 2009, received in International application No. PCT/US2009/002400.

Office Action mailed Jul. 28, 2009, received in U.S. Appl. No. 12/149,151.

International Bureau of WIPO. International Preliminary Report on Patentability, International Application No. PCT/US09/59188. (mailed Apr. 21, 2011).

* cited by examiner

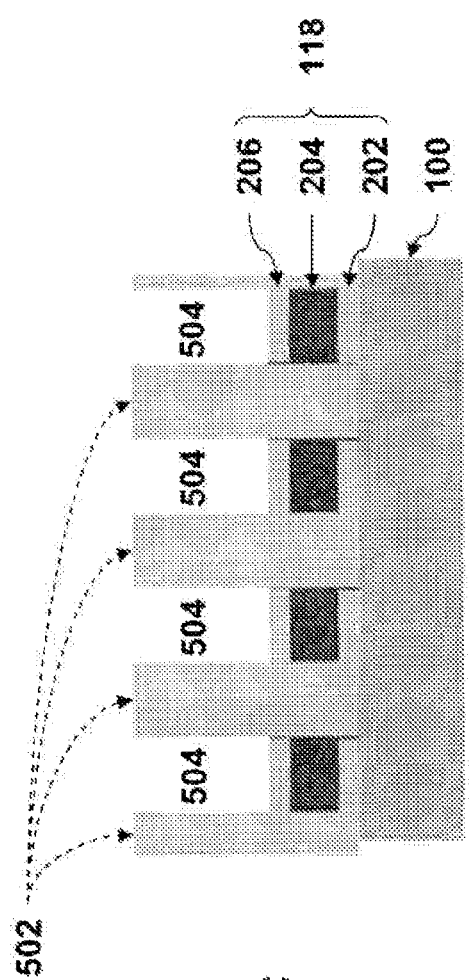
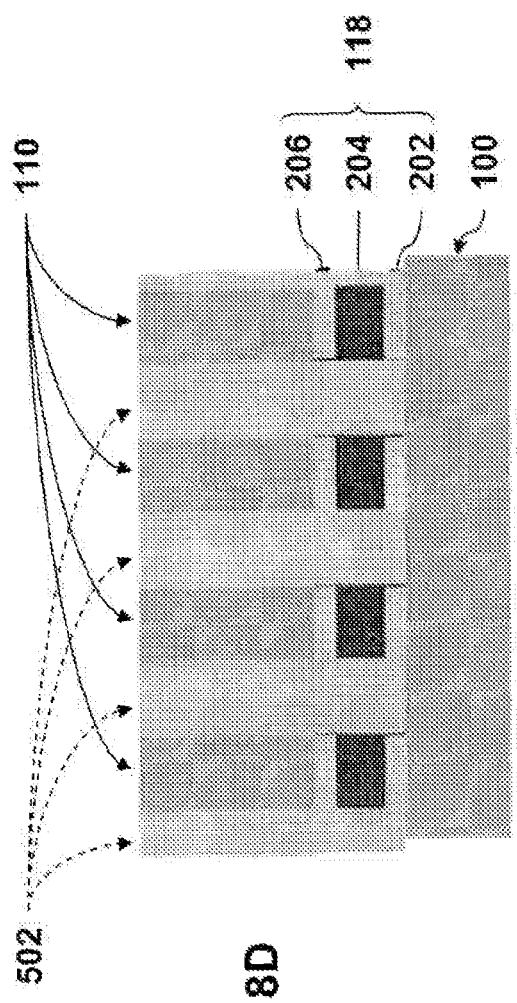
Figure 8C
Figure 8D

METHOD OF MAKING SUB-RESOLUTION PILLAR STRUCTURES USING UNDERCUTTING TECHNIQUE

BACKGROUND OF THE INVENTION

The invention relates generally to a method for making a semiconductor device, for example, a nonvolatile memory array containing a diode steering element.

One prior art process using a hard mask stack shown in FIG. 1A can be used to fabricate 45 nm and 80 nm features. The stack consists of a layer of organic hard mask 103, also known as an amorphous carbon advanced patterning film (APF), a layer of Dielectric Anti-Reflective Coating (DARC) 106, such as silicon oxynitride, on top of organic hard mask 103, and a Bottom Anti-Refection Coating (BARC) 109 layer, such as an organic BARC layer, on top of DARC layer 106. A photoresist 111 can be coated above the BARC layer. A device layer 110 can be etched using at least one or more layers of the stack as a mask.

SUMMARY OF THE EMBODIMENTS

One embodiment of the invention provides a method of making a device, including forming an underlying mask layer over an underlying layer, forming a first mask layer over the underlying mask layer, patterning the first mask layer to form first mask features, undercutting the underlying mask layer to form underlying mask features using the first mask features as a mask, removing the first mask features, and patterning the underlying layer using at least the underlying mask features as a mask.

Another embodiment of the invention provides a method of making a device, including forming an underlying mask layer over an underlying layer, forming a first mask layer over the underlying mask layer, patterning the first mask layer to form first mask features, undercutting the underlying mask layer to form underlying mask features using the first mask features as a mask, forming filler features between the underlying mask features and over the underlying layer using the first mask features as a mask, wherein the filler features do not contact the underlying mask features, removing the first mask features, and patterning the underlying layer using at least a combination of the underlying mask features and filler features as a mask.

Another embodiment of this invention provides a method of making a device, including forming an underlying mask layer over an underlying layer, wherein the underlying layer comprises a resistivity switching storage element layer and a bottom hard mask layer over the resistivity storage element layer, forming a first mask layer over the underlying mask layer, patterning the first mask layer to form first mask features, undercutting the underlying mask layer to form underlying mask features using the first mask features as a mask, removing the first mask features, etching the bottom hard mask layer using at least the underlying mask features as a mask to form first openings, filling the first openings with an insulating material, removing the underlying mask features, removing the bottom hard mask layer to form second openings exposing top of the resistivity switching storage element layer, and filling the second openings with at least one semiconductor material to form semiconductor diodes having a substantially pillar shape in the second openings.

BRIEF DESCRIPTION OF THE DRAWINGS

FIGS. 8A through 8D are top views illustrating stages in formation of a device according to another embodiment of the present invention.

DETAILED DESCRIPTION OF THE PREFERRED EMBODIMENTS

One embodiment of the invention provides a method of making a device, including forming an underlying mask layer over an underlying layer, forming a first mask layer over the underlying mask layer, patterning the first mask layer to form first mask features, undercutting the underlying mask layer to form underlying mask features using the first mask features as a mask, removing the first mask features, and patterning the underlying layer using at least the underlying mask features as a mask.

In some embodiments, the first mask layer comprises one or more hard mask layers. The method further includes forming a photoresist layer over the first mask layer, and patterning the photoresist layer to form a photoresist pattern. The step of patterning the first mask layer may use the photoresist pattern as a mask. Alternatively, the first mask layer can comprise one or more photoresist layers.

Figure 1A:
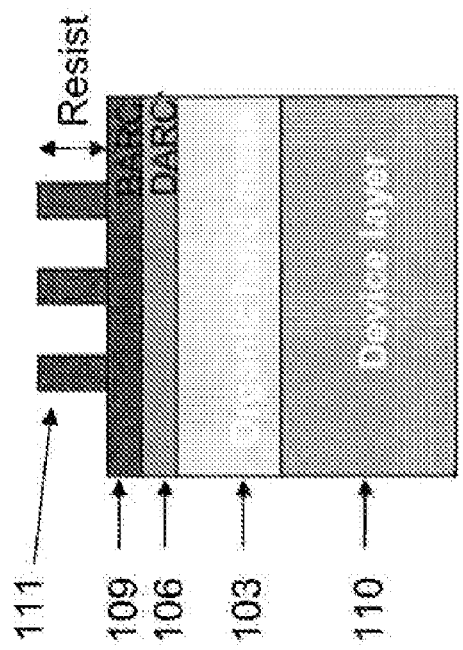
FIG. 1A is a cross-sectional view illustrating a prior art hard mask configuration.
Figure 2A:
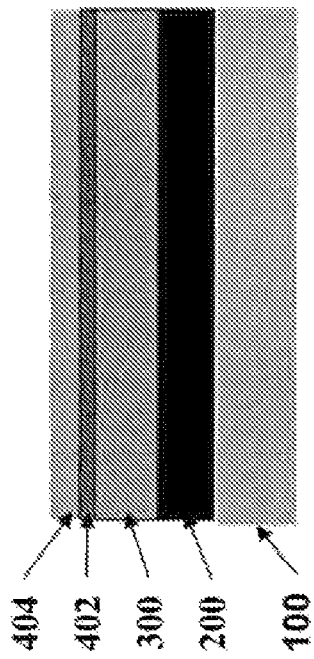
FIGS. 2A, 3A, and 4A are top views illustrating stages in formation of a device according to an embodiment of the present invention.
Figure 2B:
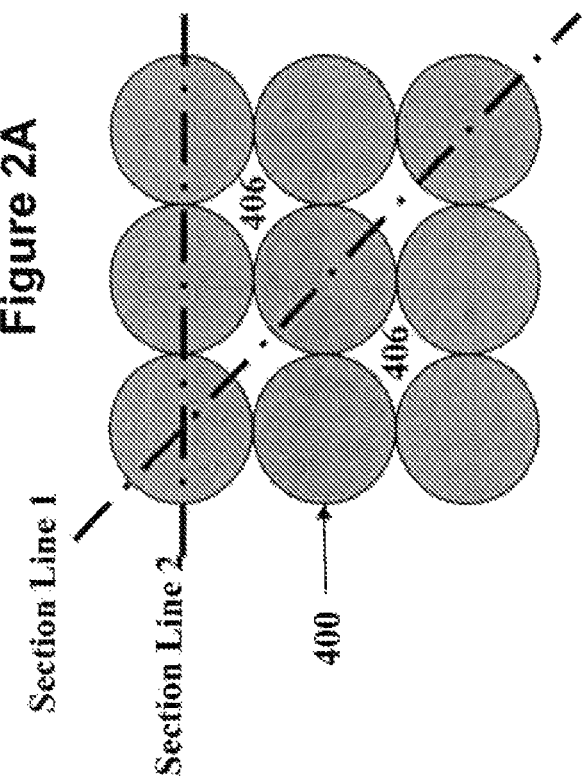
FIGS. 2B, 3B, and 4B are cross-sectional views along the section line 1 of the structures shown in FIGS. 2A, 3A, and 4A, respectively.
Figure 2C:
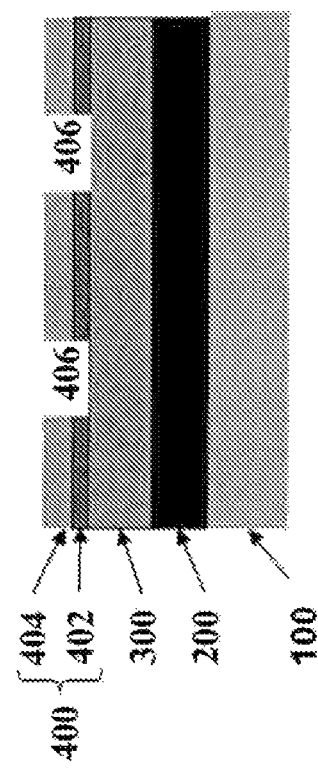
FIGS. 2C, and 3C are cross-sectional views along the section line 2 of the same structures shown in FIGS. 2A, and 3A, respectively.

Referring to FIGS. 2B and 2C, an underlying layer 200 is formed over a substrate 100. The substrate 100 can be any semiconductor substrate known in the art, such as monocrystalline silicon, IV-IV compounds such as silicon-germanium or silicon carbide, III-V compounds, II-VI compounds, epitaxial layers over such substrates, or any other semiconducting or non-semiconducting material, such as glass, plastic, metal or ceramic substrate. The substrate may include integrated circuits fabricated thereon, such as driver circuits and/or electrodes for a memory device. The underlying layer 200 can be selected from organic hard mask layer, an oxide hard mask layer, a device layer, or combinations thereof. In some embodiments, the underlying layer 200 comprises at least one semiconductor device layer. Any suitable semiconductor materials such as silicon, germanium, silicon germanium, or other compound semiconductor materials, may be used. However, other device layers, including insulating layers, such as silicon oxide or silicon nitride layers, or conductive layers, such as aluminum, copper, tungsten, titanium, titanium nitride, and alloys thereof may also be used.

After an underlying mask layer 300 is formed over the underlying layer 200, a first mask layer (not shown) is formed over the underlying mask layer 300, which is then patterned to form first mask features 400. The underlying mask layer 300 can be partially exposed in openings 406 that are defined by the first mask features 400. In some embodiments, as shown in FIGS. 2A (top view), 2B (cross-sectional view along the section line 1), and 2C (cross-sectional view along the section line 2), the first mask features 400 comprise sub-resolution features which contact with each other. For example, features may comprise circles or ovals which touch at least one adjacent neighbor (since they are below resolution of the particular lithography system). For example, features 400 may comprise circles arranged in a square or rectangular pattern where each circle contacts four adjacent neighbors.

The first mask features 400 can comprise one or more hard mask layers, such as a BARC layer, a DARC layer (for example silicon oxynitride), a titanium nitride layer, or a combination thereof. Preferably, as shown in FIGS. 2A and 2B, the first mask features 400 can comprise a titanium nitride layer 402, and a DARC layer 404. The underlying mask layer 300 can comprise any suitable material that can be selectively etched using the first mask features 400 as a mask. For example, the underlying mask layer 300 may contain tungsten, while the first mask features 400 comprise titanium nitride. Layer 300 may comprise other materials, such as silicon oxide, an organic material or amorphous carbon (APF).

Figure 3C:
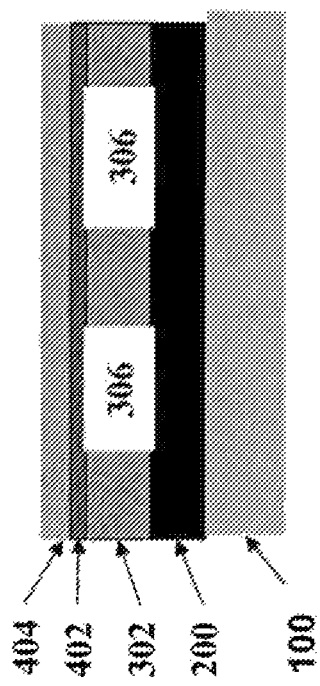
Figure 3A:
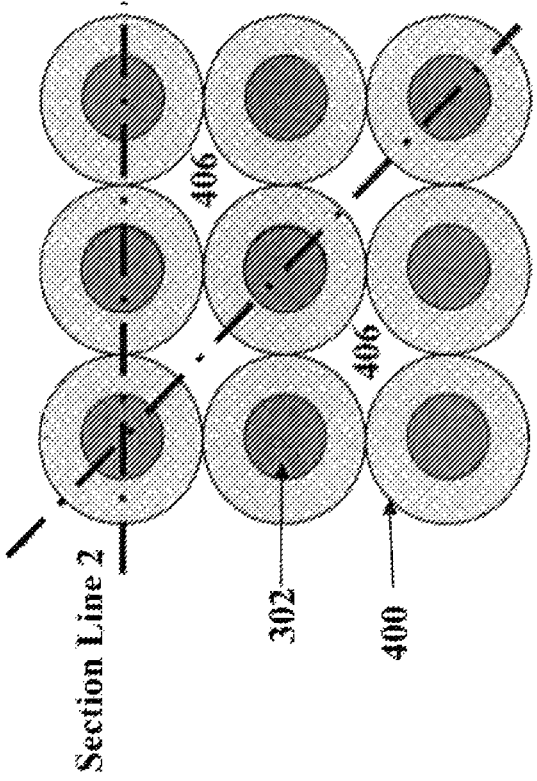
Figure 3B:
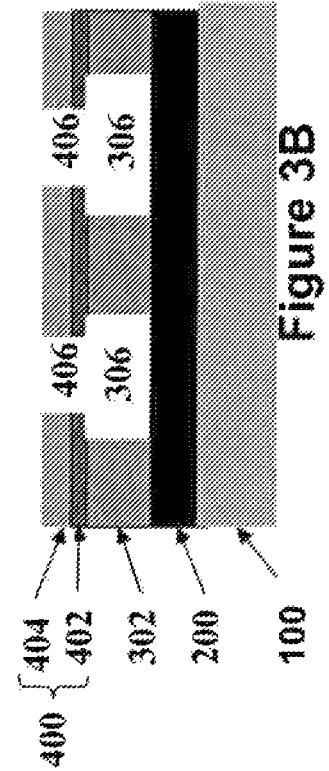

The underlying mask features 302 can be formed by undercut the underlying mask layer 300. In some embodiments, the step of undercutting can be a step of selectively wet etching the underlying mask layer 300 using the first mask features 400 as a mask. Optionally, a step of dry etching the underlying mask layer 300 using the first mask features 400 as a mask, may be conducted prior to the wet etching. The resulting structure after the undercutting step is shown in FIGS. 3A (top view), 3B (cross-sectional view along the section line 1), and 3C (cross-sectional view along the section line 2). The openings 306 formed during the step of the undercutting, as illustrated in FIGS. 3B and 3C, partially expose the underlying layer 200 that is located underneath the first mask features 400.

Figures 4A, 4B:
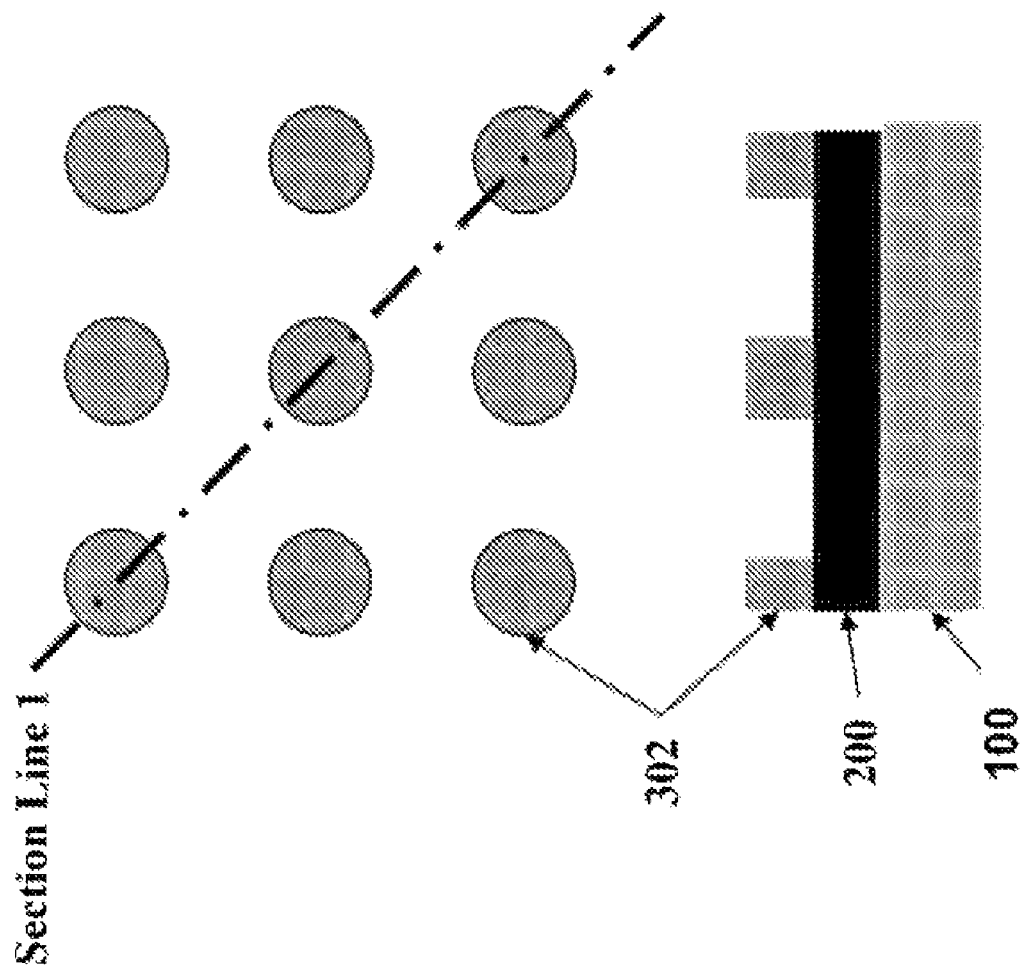

The first mask features 400 can then be removed, resulting in a structure shown in FIGS. 4A (top view), and 4B (cross-sectional view along the section line 1). The underlying mask features 302 can be used as a mask in a following step of etching the underlying layer 200. Features 302 may have a sublithographic size due to the undercutting.

Figure 5A:
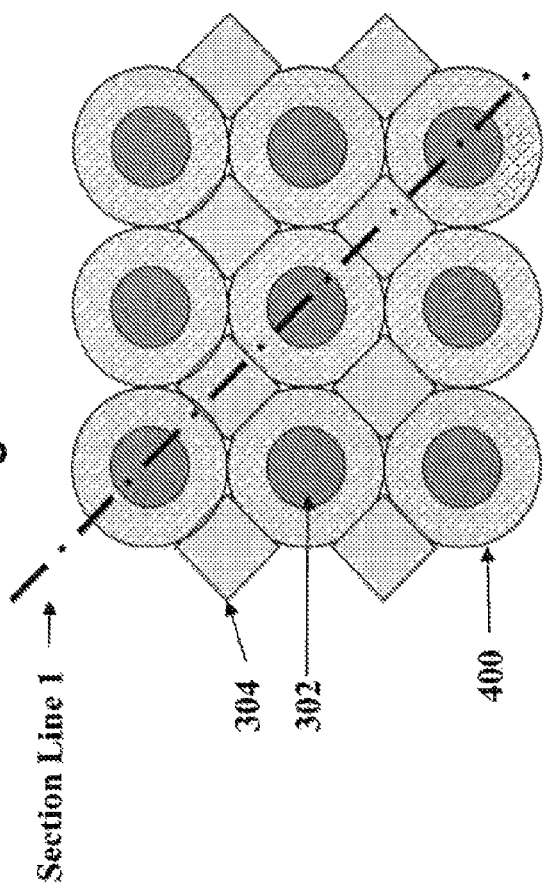
FIGS. 5A, 6A, and 7A are top views illustrating stages in formation of a device according to a second embodiment of the present invention.
Figure 5B:
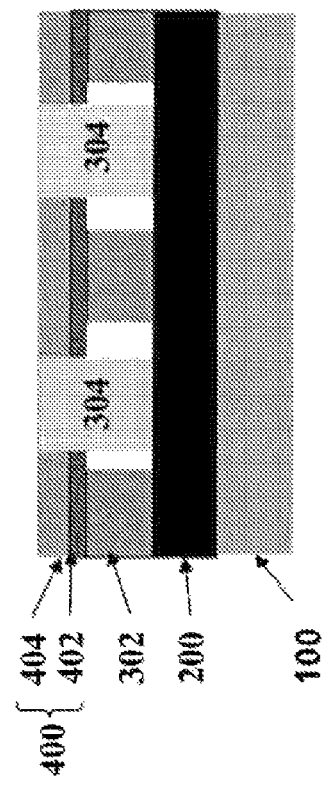
FIGS. 5B, 6B, and 7B are cross-sectional views along the section line 1 of the same structures shown in FIGS. 5A, 6A, and 7A, respectively.

Alternatively, as shown in FIGS. 5A and 5B, prior to the step of removing the first mask features 400, filler features 304 can be formed between the underlying mask features 302 and over the underlying layer 200, using the first mask features 400 as a mask, in such a way that the filler features 304 do not contact the underlying mask features 302.

Figure 6A:
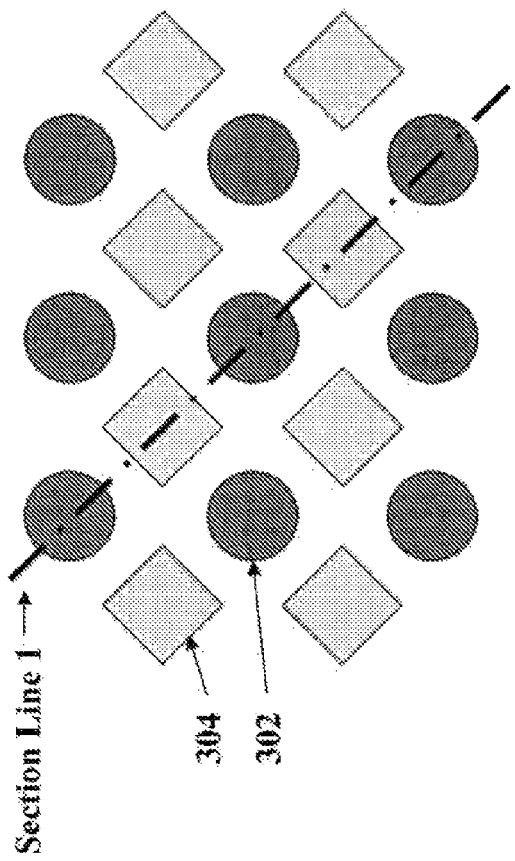
Figure 6B:
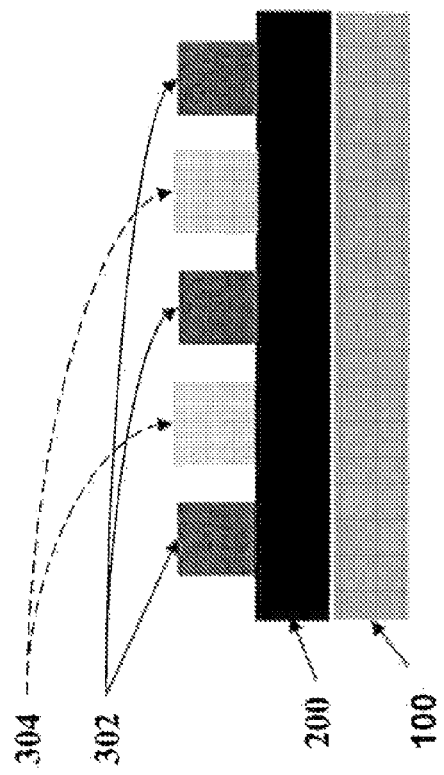

The step of forming the filler features 304 can comprise depositing a filler layer over the underlying layer 200 and over and between the first mask features 400, and planarizing, such as chemical mechanical polishing the filler layer using the top of the first mask features 400 as a polish stop. This results in a structure illustrated in FIGS. 5A (top view), and 5B (cross-sectional view along the section line 1). The first mask features 400 (and optionally the upper portions of the filler features 304) can then be removed by etching or CMP methods, to form a structure illustrated in FIGS. 6A (top view), and 6B (cross-sectional view along the section line 1). Alternatively, the steps of forming filler features 304 and removing the first mask features 400 comprises depositing a filler layer over the underlying layer 200 and over and between the first mask features 400, and chemical mechanical polishing the filler layer and the first mask features using the top of the underlying mask features 302 as a polish stop. In this embodiment, a plurality of cylindrical underlying mask features 302 and right angle parallelepiped shaped filler features 304 are formed. In the specific layout of FIG. 6A, each feature 302 is surrounded by four equidistant features 304 and vise-versa.

Figure 7A:
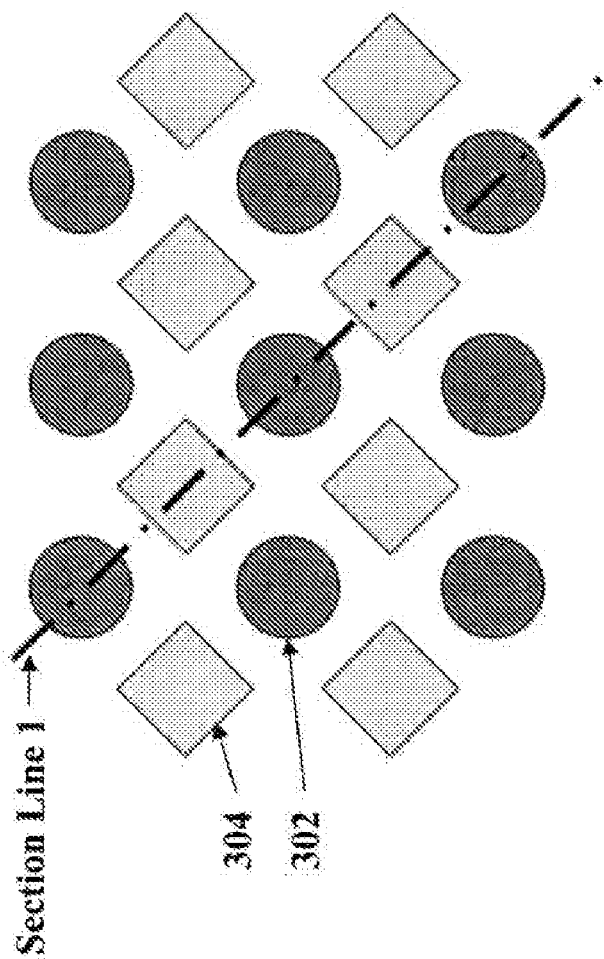
Figure 7B:
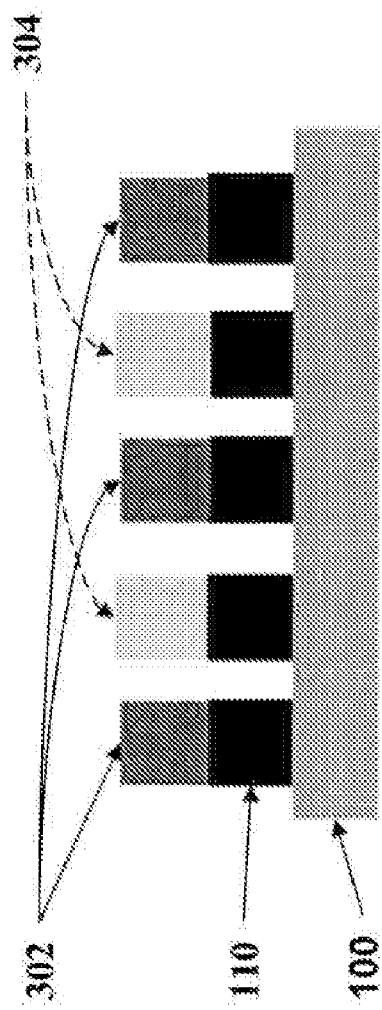

Turning to FIGS. 7A (top view), and 7B (cross-sectional view along the section line 1), the underlying layer 200 can then be patterned using at least a combination of the underlying mask features 302 and the filler features 304 as a mask, forming an array of pillars 110. In this embodiment, a plurality of cylindrical pillars and right angle parallelepiped pillars are formed using respective features 302 and 304 as a mask. In the specific layout of FIG. 7A, each cylindrical pillar is surrounded by four equidistant parallelepiped pillars and vise-versa.

In some embodiments, the underlying layer 200 comprises at least one semiconductor layer, and the step of patterning the underlying layer 200 forms an array of semiconductor pillars 110. For example, layer 200 may comprise a p-type and n-type semiconductor layers to form a p-n diode pillar 110 diode. Alternatively, layer 200 may comprise p-type, intrinsic and n-type layers to form a p-i-n pillar 110 diode.

Figure 9:
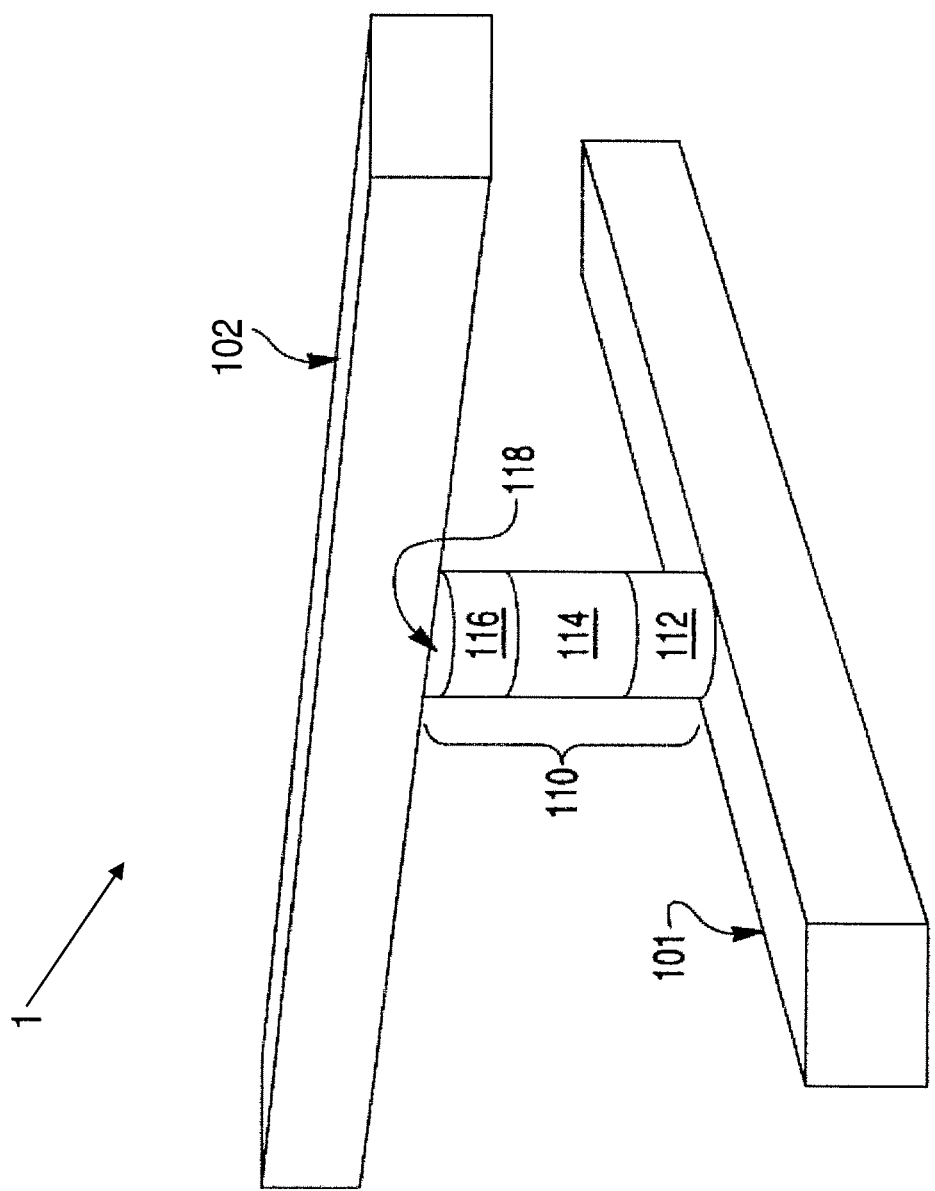
FIG. 9 is a perspective view of a memory cell formed according to an embodiment of the present invention.

The diode 110 may be a steering element of a memory cell, for example, a memory cell 1 illustrated in FIG. 9, which further includes a storage element. The storage element may comprise a resistivity switching element. The resistivity switching element can be an antifuse dielectric, such as a metal oxide dielectric layer or another element, and the diode and the antifuse dielectric layer can be arranged in series (with the diode being above or below the dielectric). The storage element may be patterned together with the steering element or it may be formed over the steering element after the etching step. For example, the antifuse dielectric may be formed by oxidizing an upper portion of a semiconductor diode 110.

In some other embodiments, the underlying layer 200 comprises a resistivity switching storage element layer 118 and a bottom hard mask layer 208 over the resistivity storage element layer 118. A structure shown in FIG. 8A can be obtained, by etching the underlying layer 200 using at least the underlying mask features 302 (or the combination of the underlying mask features 302 and the filler features 304 in some embodiments) as a mask. Alternatively, the underlying layer 200 can be partially etched. For example, the step of etching the underlying layer 200 may use the top of the resistivity switching storage element layer 118 as a stop, therefore, only the bottom hard mask layer 208 is etched.

Figure 8A:
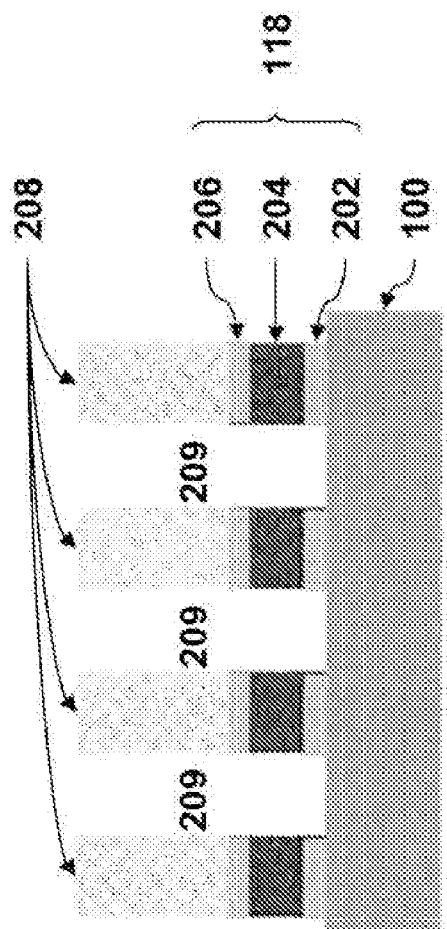

The resistivity switching element layer 118 can contain a metal-insulator-metal stack 200 that comprises a first electrically conductive layer 202, an insulating layer 204 over the first electrically conductive layer 202, and a second electrically conductive layer 206, as shown in FIG. 8A. Any suitable conductive material can be used for the first 202 and second 206 conductive layers, for example, tungsten, aluminum, copper, or alloys thereof. The insulating layer 204 can be an antifuse dielectric layer selected from a group consisting of hafnium oxide, aluminum oxide, titanium oxide, lanthanum oxide, tantalum oxide, ruthenium oxide, zirconium silicon oxide, aluminum silicon oxide, hafnium silicon oxide, hafnium aluminum oxide, hafnium silicon oxynitride, zirconium silicon aluminum oxide, hafnium aluminum silicon oxide, hafnium aluminum silicon oxynitride, zirconium silicon aluminum oxynitride, silicon oxide, silicon nitride, or a combination thereof. The bottom hard mask layer can comprise any suitable hard mask material, such as silicon oxide or silicon nitride. In a preferred embodiment, the bottom hard mask layer comprises an organic hard mask layer.

Figure 8B:
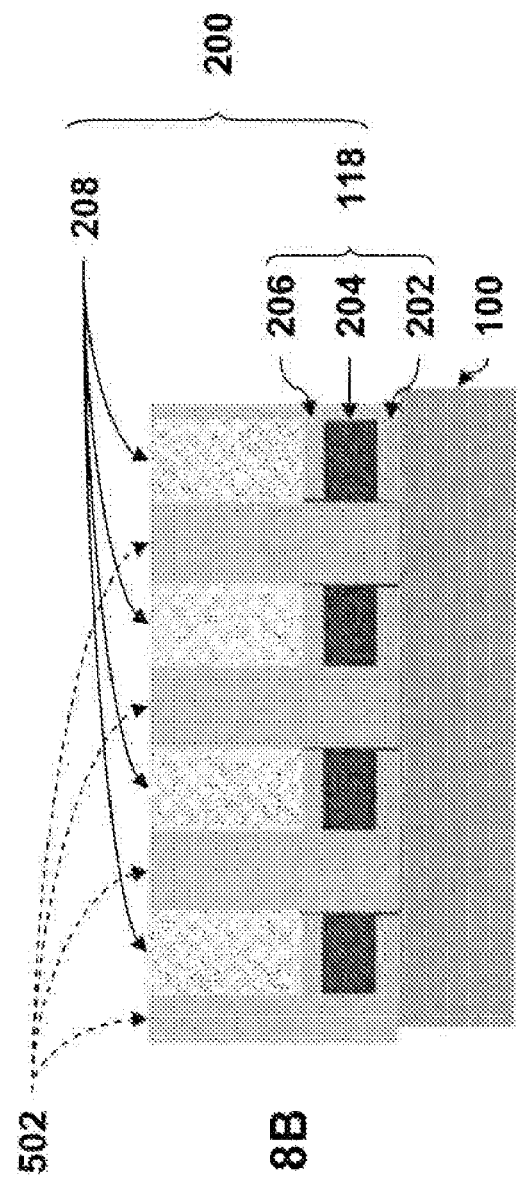

Tuning to FIG. 8B, the first openings 209, which are formed by the step of etching the underlying layer 200, can be filled by an insulating material 502. Any suitable insulating material can be used for the insulating layer 512, for example silicon oxide, silicon nitride, high-dielectric constant film, Si—C—O—H film, or a combination thereof.

The bottom hard mask layer 208 can then be removed, as shown in FIG. 8C, forming second openings 504 exposing top of the resistivity switching storage element layer 118. The second openings 504 can then be filled with at least one semiconductor material to form semiconductor diodes 110, as shown in FIG. 8D, having a substantially pillar shape. The diodes 110 may be a steering element of a memory cell, for example the memory cell 1 illustrated in FIG. 9.

The semiconductor diodes 110 may be formed by selectively growing the semiconductor material in the second openings 504, or by depositing the semiconductor material in the second openings 504 and over the insulating layer 502 and planarized by CMP or etchback. For a p-n diode, the p-type and the n-type layers may be deposited and/or selectively grown. For a p-i-n diode, the upper diode region, such as the p-type region, may be formed by implanting suitable dopants into the upper portion of the intrinsic region.

The memory cell can be further located in a monolithic three dimensional array of memory cells. The memory cell can be a read/write memory cell or a rewritable memory cell. The memory cell type can be selected from at least one of antifuse, fuse, polysilicon memory effect cell, metal oxide memory, switchable complex metal oxide, carbon nanotube memory, graphene, amorphous or polycrystalline carbon switchable resistance material, phase change material memory, conductive bridge element, or switchable polymer memory. U.S. application Ser. Nos. 11/864,532 and 11/819, 595, U.S. Published Application Numbers US 2007/0164309 A1 and US 2007/0072360 A1, and U.S. Pat. Nos. 6,946,719, 6,952,030, 6,853,049, disclosing memory cells and methods of making and/or using thereof, are hereby incorporated by reference in their entirety.

In preferred embodiments, the memory cell includes a cylindrical semiconductor diode located in series with the storage element. The diode and the storage element are disposed between two electrodes, as illustrated in FIG. 9. The diode and the storage element may have a shape other than cylindrical, such as the parallelepiped shape described above, if desired. For a detailed description of a the design of a memory cell comprising a diode and a metal oxide, see for example U.S. patent application Ser. No. 11/125,939 filed on May 9, 2005 (which corresponds to US Published Application No. 2006/0250836 to Herner et al.), and U.S. patent application Ser. No. 11/395,995 filed on Mar. 31, 2006 (which corresponds to US Patent Published Application No. 2006/0250837 to Herner et al.), each of which is hereby incorporated by reference. In the preferred embodiments of the invention, the storage element serves as the resistivity switching element and the diode as the steering element of the memory cell.

As a non-limiting example, FIG. 9 illustrates the perspective view of a memory cell formed according to a preferred embodiment of the present invention. A bottom conductor 101 is formed of a conductive material, for example tungsten, and extends in a first direction. Barrier and adhesion layers, such as TiN layers, may be included in bottom conductor 101. The semiconductor diode 110 has a bottom heavily doped n-type region 112; an intrinsic region 114, which is not intentionally doped; and a top heavily doped p-type region 116, though the orientation of this diode may be reversed. Such a diode, regardless of its orientation, will be referred to as a p-i-n diode or simply diode. The resistivity switching layer 118 is disposed on the diode, either on the p-type region 116 or below the n-region 112 of the diode 110. Top conductor 102 may be formed in the same manner and of the same materials as bottom conductor 101, and extends in a second direction different from the first direction. The semiconductor diode 110 is vertically disposed between bottom conductor 101 and top conductor 102. The diode can comprise any single crystal, polycrystalline, or amorphous semiconductor material, such as silicon, germanium, or silicon-germanium alloys.

The above described memory cell shown in FIG. 9 may be located in a one memory level device. If desired, additional memory levels can be formed above the first memory level to form a monolithic three dimensional memory array. In some embodiments, conductors can be shared between memory levels; i.e. top conductor 102 shown in FIG. 9 would serve as the bottom conductor of the next memory level. In other embodiments, an interlevel dielectric is formed above the first memory level, its surface planarized, and construction of a second memory level begins on this planarized interlevel dielectric, with no shared conductors.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits and fabrication steps are not specifically described, such circuits and protocols are well known, and no particular advantage is afforded by specific variations of such steps in the context of practicing this invention. Moreover, it is believed that one of ordinary skill in the art, equipped with the teaching of this disclosure, will be able to carry out the invention without undue experimentation.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention.

What is claimed is:

1. A method of making a device, comprising:
   forming an underlying mask layer over an underlying layer;
   forming a first mask layer over the underlying mask layer;
   patterning the first mask layer to form first mask features;
   undercutting the underlying mask layer to form underlying mask features using the first mask features as a mask;
   removing the first mask features; and patterning the underlying layer using at least the underlying mask features as a mask, wherein:
the first mask features comprise subresolution features which contact with each other.

2. The method of claim 1, wherein:
the method further comprises:
forming a photoresist layer over the first mask layer; and
patterning the photoresist layer to form a photoresist pattern; and
the step of patterning the first mask layer uses the photoresist pattern as a mask.

3. The method of claim 1, wherein undercutting the underlying mask layer comprises wet etching the underlying mask layer.

4. The method of claim 3, wherein undercutting the underlying mask layer further comprises dry etching the underlying mask layer using the first mask features as a mask, prior to the step of wet etching.

5. The method of claim 1, wherein the underlying layer is selected from the group consisting of an organic hard mask layer, an oxide hard mask layer, a device layer and combinations thereof.

6. The method of claim 5, wherein:
the device layer comprises at least one semiconductor layer; and
the step of patterning the device layer forms an array of semiconductor pillars.

7. A method of making a device, comprising:
forming an underlying mask layer over an underlying layer;
forming a first mask layer over the underlying mask layer;
patterning the first mask layer to form first mask features;
undercutting the underlying mask layer to form underlying mask features using the first mask features as a mask;
removing the first mask features; and
patterning the underlying layer using at least the underlying mask features as a mask, wherein:
the underlying mask layer comprises tungsten; and
the first mask layer comprises a BARC layer, a DARC layer, a titanium nitride layer, or a combination thereof.

8. The method of claim 7, wherein the first mask features comprise sub-resolution features which contact with each other.

9. A method of making a device, comprising:
forming an underlying mask layer over an underlying layer;
forming a first mask layer over the underlying mask layer;
patterning the first mask layer to form first mask features;
undercutting the underlying mask layer to form underlying mask features using the first mask features as a mask;
removing the first mask features; and
patterning the underlying layer using at least the underlying mask features as a mask,
wherein: the underlying layer is selected from the group consisting of an organic hard mask layer, an oxide hard mask layer, a device layer and combinations thereof;
the device layer comprises at least one semiconductor layer; and
the step of patterning the device layer forms an array of semiconductor pillars, wherein each semiconductor pillar comprises a diode, wherein the diode is a steering element of a memory cell, and wherein the memory cell further comprises a storage element.

10. The method of claim 9, wherein the memory cell type is selected from at least one of antifuse, fuse, polysilicon memory effect cell, metal oxide memory, switchable complex metal oxide, carbon nanotube memory, graphene or polycrystalline carbon switchable resistance material, phase change material memory, conductive bridge element, or switchable polymer memory.

11. The method of claim 9, wherein the storage element comprises a resistivity switching element.

12. The method of claim 9, wherein the memory cell is a read/write memory cell or a rewritable memory cell.

13. The method of claim 9, wherein the memory cell is located in a monolithic three dimensional array of memory cells.

14. A method of making a device, comprising:
forming an underlying mask layer over an underlying layer;
forming a first mask layer over the underlying mask layer;
patterning the first mask layer to form first mask features;
undercutting the underlying mask layer to form underlying mask features using the first mask features as a mask;
forming filler features between the underlying mask features and over the underlying layer using the first mask features as a mask, wherein the filler features do not contact the underlying mask features;
removing the first mask features; and
patterning the underlying layer using at least a combination of the underlying mask features and filler features as a mask.

15. The method of claim 14, wherein:
the method further comprises:
forming a photoresist layer over the first mask layer; and
patterning the photoresist layer to form a photoresist pattern; and
the step of patterning the first mask layer uses the photoresist pattern as a mask.

16. The method of claim 14, wherein the step of forming the filler features comprises:
depositing a filler layer over the underlying layer and the first mask features,
wherein the filler features do not contact the underlying mask features; and
chemical mechanical polishing the filler layer to expose top of the first mask features.

17. The method of claim 14, wherein the steps of forming filler features and removing the first mask features comprise:
depositing a filler layer over the underlying layer and the first mask features; and
chemical mechanical planarizing the filler layer and the first mask features to expose top of the underlying mask features.

18. The method of claim 14, wherein undercutting the underlying mask comprising wet etching the underlying mask layer.

19. The method of claim 18, wherein undercutting the underlying mask layer further comprises dry etching the underlying mask layer using the first mask features as a mask prior to the step of wet etching.

20. The method of claim 14, wherein the first mask layer comprises a BARC layer, a DARC layer, a titanium nitride layer, or a combination thereof.

21. A method of making a device, comprising:
forming an underlying mask layer over an underlying layer, wherein the underlying layer comprises a resistivity switching storage element layer and a bottom hard mask layer over the resistivity storage element layer;
forming a first mask layer over the underlying mask layer;
patterning the first mask layer to form first mask features;
undercutting the underlying mask layer to form underlying mask features using the first mask features as a mask;

removing the first mask features;
etching the bottom hard mask layer using at least the underlying mask features as a mask to form first openings;
filling the first openings with an insulating material;
removing the underlying mask features;
removing the bottom hard mask layer to form second openings exposing top of the resistivity switching storage element layer; and
filling the second openings with at least one semiconductor material to form semiconductor diodes having a substantially pillar shape in the second openings.

22. The method of claim 21, wherein:
the method further comprises:
  forming a photoresist layer over the first mask layer; and
  patterning the photoresist layer to form a photoresist pattern; and
  the step of patterning the first mask layer uses the photoresist pattern as a mask.

23. The method of claim 21, wherein the resistivity switching element layer comprises a metal-insulator-metal stack.

24. The method of claim 21, wherein the bottom hard mask layer comprises an organic hard mask layer.

25. The method of claim 21, wherein undercutting the underlying mask layer comprises wet etching the underlying mask layer.

26. The method of claim 25, wherein undercutting the underlying mask layer further comprises dry etching the underlying mask layer using the first mask features as a mask prior to the step of wet etching.

* * * * *